(12) United States Patent
Wan et al.

(10) Patent No.: US 12,399,643 B2
(45) Date of Patent: Aug. 26, 2025

(54) DATA PROTECTION FOR THREE-DIMENSIONAL NAND MEMORY

(71) Applicant: Yangtze Memory Technologies Co., Ltd., Hubei (CN)

(72) Inventors: Jie Wan, Hubei (CN); Wei Tao, Hubei (CN); Yuan Tao, Hubei (CN); Ling Du, Hubei (CN); Boxuan Cheng, Hubei (CN); Jian Cao, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 262 days.

(21) Appl. No.: 17/487,870

(22) Filed: Sep. 28, 2021

(65) Prior Publication Data

US 2023/0004297 A1 Jan. 5, 2023

Related U.S. Application Data

(63) Continuation of application No. PCT/CN2021/103395, filed on Jun. 30, 2021.

(51) Int. Cl.
*G06F 3/06* (2006.01)
*G11C 16/04* (2006.01)
(Continued)

(52) U.S. Cl.
CPC ............ *G06F 3/065* (2013.01); *G06F 3/0619* (2013.01); *G06F 3/0679* (2013.01);
(Continued)

(58) Field of Classification Search
CPC ....... G06F 3/065; G06F 12/02; G06F 12/0246
(Continued)

(56) References Cited

U.S. PATENT DOCUMENTS 8,793,556 B1 * 7/2014 Northcott ............ G06F 12/0246
365/185.29
8,902,658 B1 * 12/2014 Raghu ................. G11C 11/5635
365/185.26

(Continued)

FOREIGN PATENT DOCUMENTS

CN 101206923 A 6/2008
CN 101246738 A 8/2008
(Continued)

OTHER PUBLICATIONS

International Search Report of the International Searching Authority directed to related International Patent Application No. PCT/CN2021/103395, mailed Mar. 28, 2022; 5 pages.

*Primary Examiner* — Titus Wong
(74) *Attorney, Agent, or Firm* — Conley Rose, P.C.

(57) ABSTRACT

The present disclosure provides a method of data protection for a three-dimensional NAND memory. The method includes programming a memory cell of the 3D NAND memory according to programming data; and backing up a portion of the programming data associated with the memory cell in response to a program loop count (PLC) that is larger than a threshold value, where the PLC tracks a repeated number of the programming of the memory cell. A previous PLC can be set as the threshold value, where the previous PLC was used by a previous programming operation and was collected after the memory cell was programmed successfully to a previous target logic state.

18 Claims, 12 Drawing Sheets

(51) Int. Cl.
  *G11C 16/10* (2006.01)
  *G11C 16/34* (2006.01)
  *G11C 11/56* (2006.01)

(52) U.S. Cl.
  CPC ......... *G11C 16/0483* (2013.01); *G11C 16/10* (2013.01); *G11C 16/3459* (2013.01); *G11C 11/5671* (2013.01)

(58) Field of Classification Search
  USPC ........................................................ 711/154
  See application file for complete search history.

(56) References Cited

U.S. PATENT DOCUMENTS

| | | | |
|---|---|---|---|
| 9,164,836 B2 | 10/2015 | Guo et al. | |
| 9,183,085 B1 * | 11/2015 | Northcott | G06F 11/1012 |
| 9,230,676 B1 * | 1/2016 | Pang | G11C 16/26 |
| 9,460,799 B1 | 10/2016 | Costa et al. | |
| 9,767,914 B1 | 9/2017 | Leung | |
| 10,714,198 B1 | 7/2020 | Yang et al. | |
| 2006/0083069 A1 * | 4/2006 | Fasoli | G11C 16/3481 |
| | | | 365/185.19 |
| 2008/0031047 A1 * | 2/2008 | Ha | G11C 29/021 |
| | | | 365/185.24 |
| 2008/0144370 A1 | 6/2008 | Park et al. | |
| 2008/0162789 A1 | 7/2008 | Choi et al. | |
| 2009/0285029 A1 * | 11/2009 | Shibata | G11C 16/3404 |
| | | | 365/185.24 |
| 2012/0005558 A1 * | 1/2012 | Steiner | G11C 11/5642 |
| | | | 714/763 |
| 2012/0063237 A1 | 3/2012 | Ghilardelli | |
| 2012/0069674 A1 * | 3/2012 | Lee | G11C 16/3459 |
| | | | 365/185.19 |
| 2013/0138870 A1 * | 5/2013 | Yoon | G06F 11/1072 |
| | | | 711/E12.008 |
| 2014/0310448 A1 * | 10/2014 | Nam | G06F 3/0659 |
| | | | 711/103 |
| 2015/0146484 A1 * | 5/2015 | Lee | G11C 11/5628 |
| | | | 365/185.03 |
| 2017/0125117 A1 * | 5/2017 | Tseng | G11C 16/10 |
| 2019/0043596 A1 | 2/2019 | Madraswala et al. | |

FOREIGN PATENT DOCUMENTS

| | | |
|---|---|---|
| CN | 104011800 A | 8/2014 |
| CN | 107919158 A | 4/2018 |
| JP | 2008-079438 A | 4/2008 |

* cited by examiner

DATA PROTECTION FOR THREE-DIMENSIONAL NAND MEMORY

CROSS-REFERENCE TO RELATED APPLICATIONS AND INCORPORATION BY REFERENCE

This application claims priority to PCT/CN2021/103395 filed on Jun. 30, 2021, which is incorporated herein by reference in its entirety.

TECHNICAL FIELD

The present disclosure generally relates to the field of semiconductor technology, and more particularly, to a method and a storage system of data protection for a 3D NAND memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, many layers of memory cells can be stacked vertically such that storage density per unit area can be greatly increased. The vertically stacked memory cells can form memory strings, where the channels of the memory cells are connected in each memory string. Each memory cell can be addressed through a word line and a bit line. Data (i.e., logic states) of the memory cells in an entire memory page sharing the same word line can be read or programmed simultaneously. However, due to aggressive scaling, reliability can be a concern for a 3D NAND flash memory.

BRIEF SUMMARY

Embodiments of methods and systems for data protection in a three-dimensional (3D) memory device are described in the present disclosure.

One aspect of the present disclosure provides a method of data protection for a three-dimensional NAND memory. The method includes programming a memory cell of the 3D NAND memory according to programming data; and backing up a portion of the programming data associated with the memory cell in response to a program loop count (PLC) that is larger than a threshold value, where the PLC tracks a repeated number of the programming of the memory cell. A previous PLC can be set as the threshold value, where the previous PLC was used by a previous programming operation and was collected after the memory cell was programmed successfully to a previous target logic state.

In some embodiments, the method also includes, after programming the memory cell, verifying whether the memory cell is at a target logic state according to the programming data; and repeating the programming of the memory cell when the memory cell is not at the target logic state.

In some embodiments, the method also includes collecting the PLC that tracks a repeated number of the programming.

In some embodiments, the method also includes marking the memory cell risky in response to the PLC that is larger than the threshold value.

In some embodiments, the method also includes, prior to programming the memory cell, backing up the portion of the programming data associated with the memory cell in response to a previous risky marking of the memory cell from a previous programming operation.

In some embodiments, the backing up the portion of the programming data associated with the memory cell includes programming a redundant memory cell with the portion of the programming data associated with the memory cell.

In some embodiments, the method also includes recovering the portion of the programming data associated with the memory cell from the redundant memory cell in response to an unrecoverable error correction code.

In some embodiments, the method also includes setting a previous PLC as the threshold value, wherein the previous PLC was used by a previous programming operation and was collected after the memory cell was programmed successfully to a previous target logic state.

In some embodiments, the programming the memory cell includes programming the memory cell simultaneously with other memory cells in a memory page, wherein all memory cells in the memory page share a word line.

In some embodiments, the method also includes backing up portions of the programming data associated with the memory page in response to the PLC of the memory cell.

In some embodiments, the backing up the portions of the programming data associated with the memory page comprises programming a redundant memory page with the portions of the programming data associated with the memory page.

In some embodiments, the method also includes recovering the portions of the programming data associated with the memory page from the redundant memory page in response to an unrecoverable error correction code.

Another aspect of the present disclosure provides a memory storage system. The memory storage system includes a three-dimensional (3D) NAND memory and a memory controller. The 3D NAND memory includes a plurality of memory strings, penetrating through a film stack of alternating conductive and dielectric layers disposed on a substrate, wherein each memory string comprises a plurality of memory cells. The memory controller is configured to send programming data to the 3D NAND memory to program a memory cell; and back up a portion of the programming data associated with the memory cell in response to a program loop count (PLC) that is larger than a threshold value.

In some embodiments, the PLC tracks a number of programming for the memory cell to reach a target logic state according to the programming data.

In some embodiments, the memory controller is further configured to mark the memory cell risky in response to the PLC that is larger than the threshold value.

In some embodiments, the memory controller is further configured to create a risky block table for the 3D NAND memory, wherein the risky block table comprises a first set of addresses identifying the memory cell marked risky.

In some embodiments, the memory controller is further configured to create a risky to backup table for the 3D NAND memory. The risky to backup table includes the first set of addresses identifying the memory cell marked risky; and a second set of addresses identifying a redundant memory cell, wherein the redundant memory cell is programmed with the portion of the programming data associated with the memory cell marked risky.

In some embodiments, the memory controller is further configured to recover the portion of programming data associated with the memory cell from the redundant memory cell when an unrecoverable error correction code is received.

In some embodiments, the threshold value is a previous PLC used by a previous programming operation and was collected after the memory cell was programmed successfully to a previous target logic state.

In some embodiments, the memory controller is further configured to back up the portion of the programming data associated with the memory cell, in response to a previous risky marking of the memory cell from a previous programming operation, before the memory cell is programmed.

Yet another aspect of the present disclosure provides a memory controller for a three-dimensional (3D) NAND memory. The memory control is configured to send programming data to the 3D NAND memory to program a memory cell; and back up a portion of the programming data associated with the memory cell in response to a program loop count (PLC) that is larger than a threshold value, wherein the 3D NAND memory comprises a plurality of memory strings, penetrating through a film stack of alternating conductive and dielectric layers disposed on a substrate, wherein each memory string comprises a plurality of memory cells.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
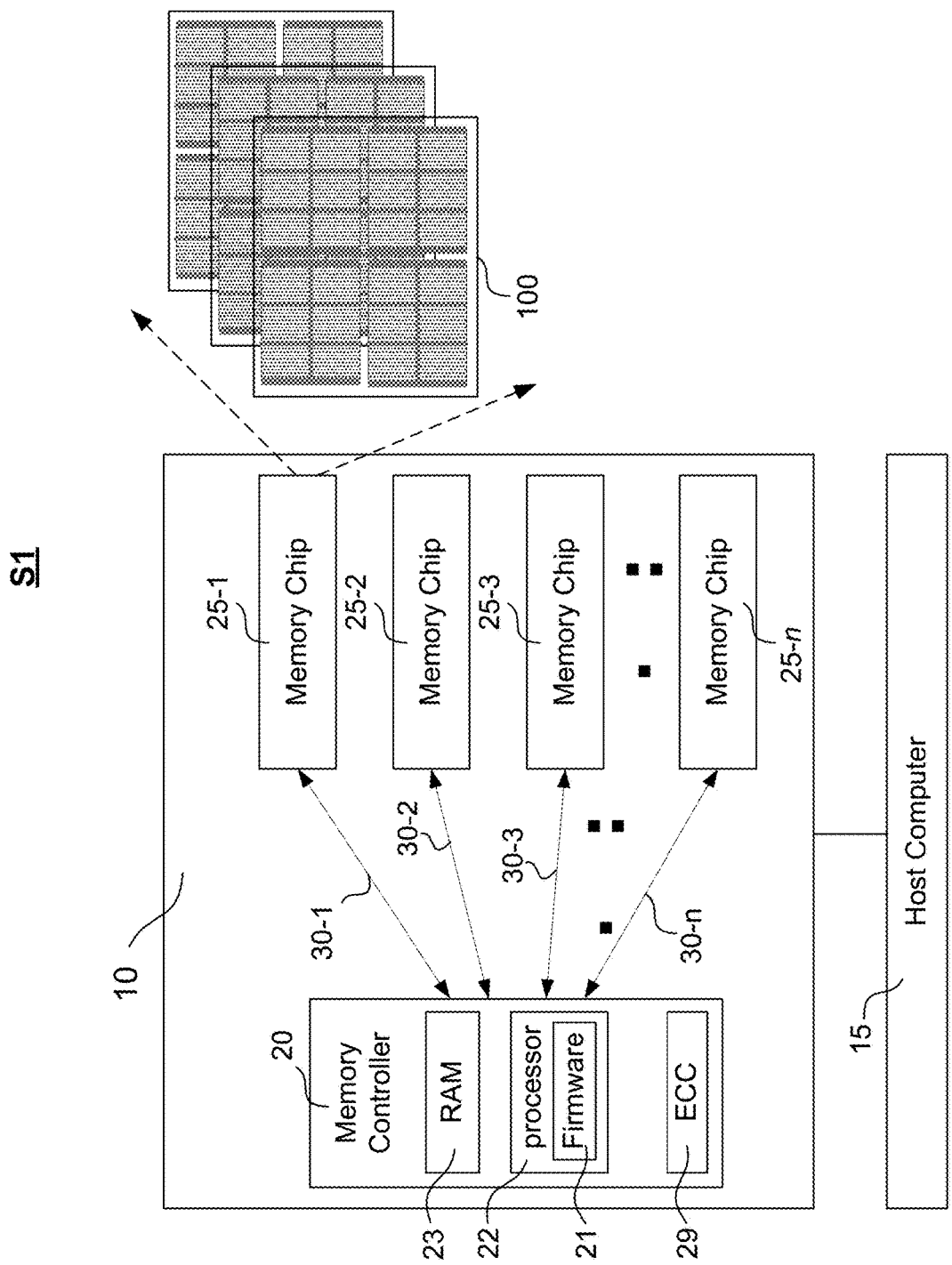
FIGS. 1 and 2A-2B illustrate a storage system with one or more memory chips, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a block diagram of an exemplary system Si having a storage system 10, according to some embodiments of the present disclosure. System Si can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. The storage system 10 (also referred to as a NAND storage system) can include a memory controller 20 and one or more semiconductor memory chips 25-1, 25-2, 25-3, . . . , 25-n. Each semiconductor memory chip 25 (hereafter just "memory chip") can be a NAND chip (i.e., "flash," "NAND flash" or "NAND"). The storage system 10 can communicate with a host computer 15 through the memory controller 20, where the memory controller 20 can be connected to the one or more memory chips 25-1, 25-2, 25-3, . . . , 25-n, via one or more memory channels 30-1, 30-2, 30-3, . . . , 30-n. In some embodiments, each memory chip 25 can be managed by the memory controller 20 via a memory channel 30.

In some embodiments, the host computer 15 can include a processor of an electronic device, such as a central processing unit (CPU), or a system-on-chip (SoC), such as an application processor (AP). The host computer 15 sends data to be stored at the NAND storage system or storage system 10 or retrieves data by reading the storage system 10.

The memory controller 20 can handle I/O requests received from the host computer 15, ensure data integrity and efficient storage, and manage the memory chip 25. To perform these tasks, the controller runs firmware 21, which can be executed by one or more processors 22 (e.g., microcontroller units, CPU) inside the controller 20. For example, the controller 20 runs firmware 21 to map logical addresses (i.e., address utilized by the host associated with host data) to physical addresses in the memory chip 25 (i.e., actual locations where the data is stored). The controller 20 also runs firmware 21 to manage defective memory blocks in the memory chip 25, where the firmware 21 can remap the logical address to a different physical address, i.e., move the data to a different physical address. The controller 20 can also include one or more memories 23 (e.g., DRAM, SRAM, EPROM, etc.), which can be used to store various metadata used by the firmware 21. In some embodiments, the memory controller 20 can also perform error recovery through an error correction code (ECC) engine 29. ECC is used to detect and correct the raw bit errors that occur within each memory chip 25.

The memory channels 30 can provide data and control communication between the memory controller 20 and each memory chip 25 via a data bus. The memory controller 20 can select one of the memory chip 25 according to a chip enable signal.

In some embodiments, each memory chip 25 in FIG. 1 can include one or more memory dies 100, where each memory die can be a 3D NAND memory.

Figure 2A:
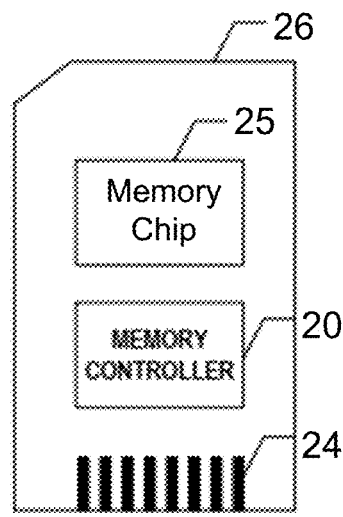
Figure 2B:
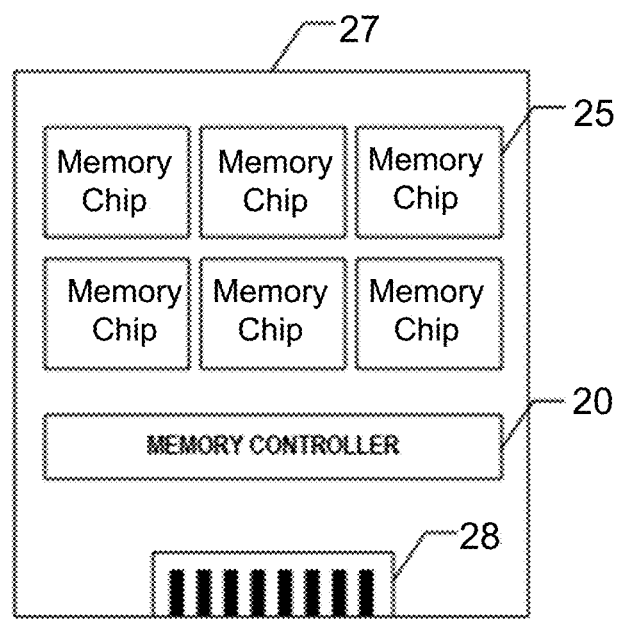

Memory controller 20 and one or more memory chip 25 can be integrated into various types of storage devices, for example, be included in the same package, such as a universal Flash storage (UFS) package or an eMMC package. That is, storage system 10 can be implemented and packaged into different types of end electronic products. In one example as shown in FIG. 2A, memory controller 20 and a single memory chip 25 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 26 can further include a memory card connector 24 coupling memory card 26 with a host (e.g., the host computer 15 in FIG. 1). In another example as shown in FIG. 2B, memory controller 20 and multiple memory chip 25 can be integrated into an solid state drive (SSD) 27. SSD 27 can further include an SSD connector 28 coupling SSD 27 with a host (e.g., the host computer 15 in FIG. 1).

Figure 3:
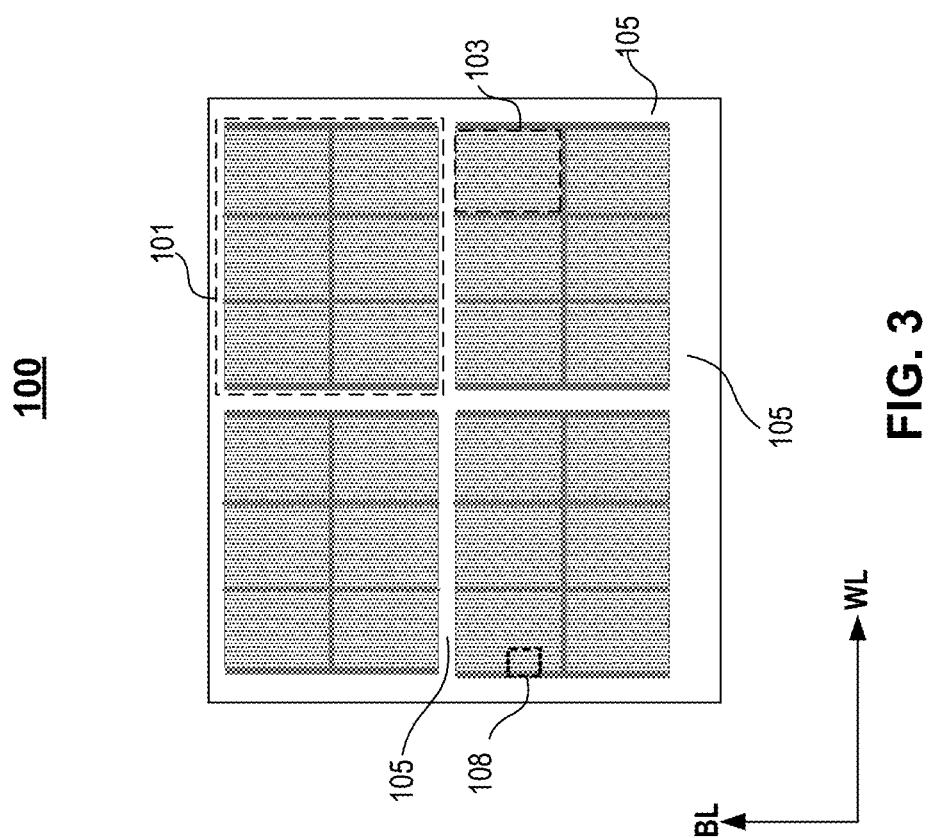
FIG. 3 illustrates a schematic diagram of a memory die, according to some embodiments of the present disclosure.

FIG. 3 illustrates a top-down view of an exemplary memory die 100, according to some embodiments of the present disclosure. The memory die 100 can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 3, the exemplary memory die 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 3. In this disclosure, memory block 103 is also referred to as a "memory array" or "array." The memory array is the core area in a memory device, performing storage functions.

The memory die 100 can also include a periphery region 105, an area surrounding memory planes 101. The periphery region 105 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

It is noted that, the arrangement of the memory planes 101 in the memory die 100 and the arrangement of the memory blocks 103 in each memory plane 101 illustrated in FIG. 3 are only used as an example, which does not limit the scope of the present disclosure.

Figure 4:
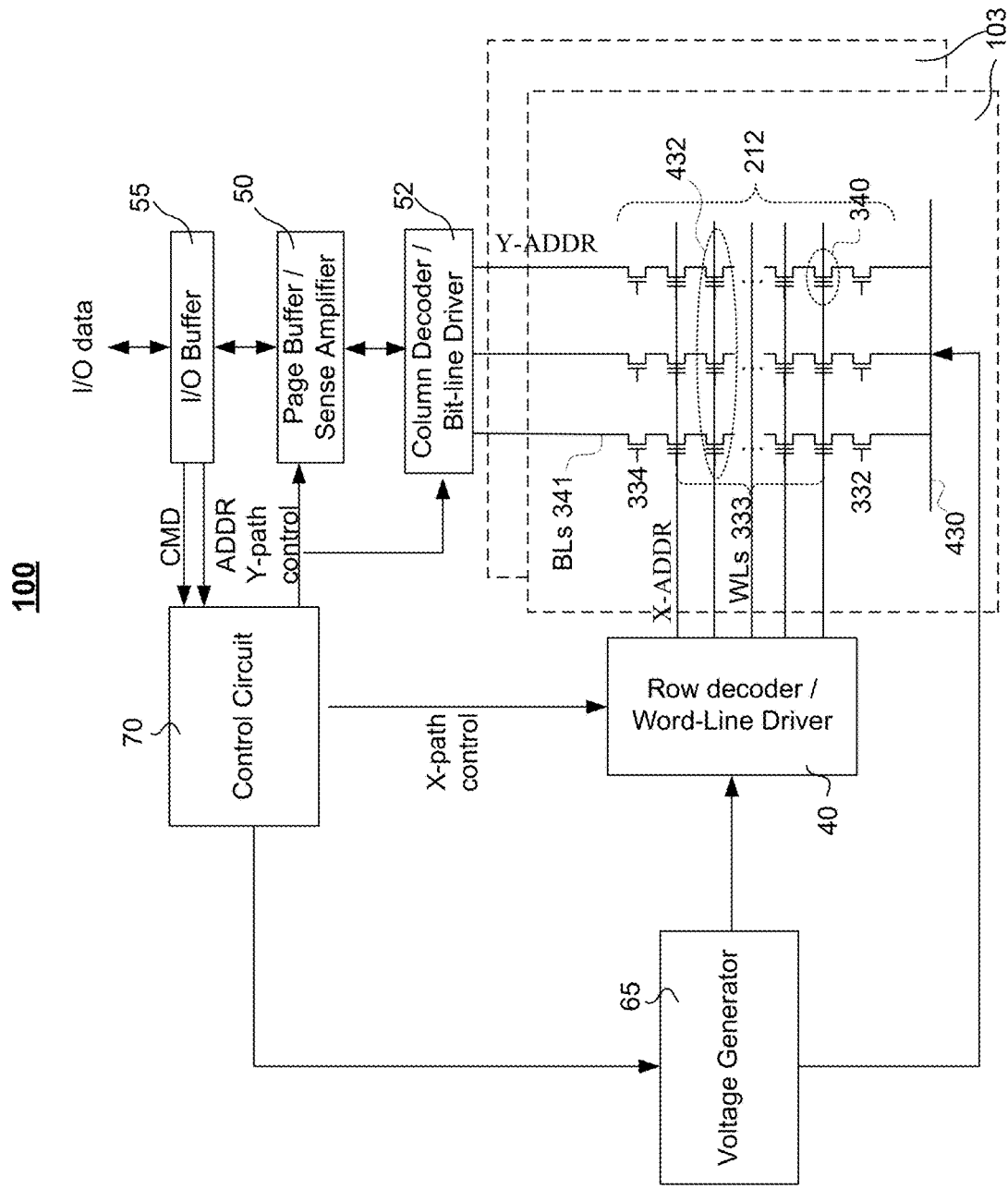
FIG. 4 illustrates a schematic of a three-dimensional (3D) memory die, according to some embodiments of the present disclosure.

FIG. 4 illustrates a schematic diagram of the memory die 100, according to some embodiments of the present disclosure. The memory die 100 includes one or more memory blocks 103 (e.g., 103-1, 103-2, 103-3). Each memory block 103 includes a plurality of memory strings 212. Each memory string 212 includes a plurality of memory cells 340. The memory cells 340 sharing the same word line forms a memory page 432. The memory string 212 can also include at least one field effect transistor (e.g., MOSFET) at each end, which is controlled by a lower select gate (LSG) 332 and a top select gate (TSG) 334, respectively. The drain terminal of the top select transistor 334-T can be connected to the bit line 341, and the source terminal of the lower select transistor 332-T can be connected to an array common source (ACS) 430. The ACS 430 can be shared by the memory strings 212 in an entire memory block, and is also referred to as the common source line.

The memory die 100 can also include a periphery circuit that includes many digital, analog, and/or mixed-signal circuits to support functions of the memory block 103, for example, a page buffer/sense amplifier 50, a row decoder/word line driver 40, a column decoder/bit line driver 52, a control circuit 70, a voltage generator 65 and an input/output buffer 55. These circuits can include active and/or passive semiconductor devices, such as transistors, diodes, capacitors, resistors, etc., as would be apparent to a person of ordinary skill in the art.

The memory blocks 103 can be coupled with the row decoder/word line driver 40 via word lines ("WLs") 333, lower select gates ("LSGs") 332 and top select gates ("TSG") 334. The memory blocks 103 can be coupled with the page buffer/sense amplifier 50 via bit lines ("BLs") 341. The row decoder/word line driver 40 can select one of the memory blocks 103 on the memory die 100 in response to a X-path control signal provided by the control circuit 70. The row decoder/word line driver 40 can transfer voltages provided from the voltage generator 65 to the word lines according to the X-path control signal. During the read and program operation, the row decoder/word line driver 40 can transfer a read voltage $V_{read}$ and a program voltage $V_{pgm}$ to a selected word line and a pass voltage $V_{pass}$ to an unselected word line according to the X-path control signal received from the control circuit 70.

The column decoder/bit line driver 52 can transfer an inhibit voltage $V_{inhibit}$ to an unselected bit line and connect a selected bit line to ground according to a Y-path control signal received from the control circuit 70. In the other words, the column decoder/bit line driver 52 can be configured to select or unselect one or more memory strings 212 according to the Y-path control signal from the control circuit 70. The page buffer/sense amplifier 50 can be configured to read and program (write) data from and to the memory block 103 according to the control signal Y-path control from the control circuit 70. For example, the page buffer/sense amplifier 50 can store one page of data to be programmed into one memory page 432. In another example, page buffer/sense amplifier 50 can perform verify operations to ensure that the data has been properly programmed into each memory cell 340. In yet another example, during a read operation, the page buffer/sense amplifier 50 can sense current flowing through the bit line 341 that reflects the logic state (i.e., data) of the memory cell 340 and amplify small signal to a measurable magnification.

The input/output buffer 55 can transfer the I/O data from/to the page buffer/sense amplifier 50 as well as addresses ADDR or commands CMD to the control circuit 70. In some embodiments, the input/output buffer 55 can function as an interface between the memory controller 20 (in FIG. 1) and the memory die 100 on the memory chip 25.

The control circuit 70 can control the page buffer/sense amplifier 50 and the row decoder/word line driver 40 in response to the commands CMD transferred by the input/output buffer 55. During the program operation, the control circuit 70 can control the row decoder/word line driver 40 and the page buffer/sense amplifier 50 to program a selected memory cell. During the read operation, the control circuit 70 can control the row decoder/word line driver 40 and the page buffer/sense amplifier 50 to read a selected memory cell. The X-path control signal and the Y-path control signal include a row address X-ADDR and a column address Y-ADDR that can be used to locate the selected memory cell in the memory block 103. The row address X-ADDR can include a page index PD, a block index BD and a plane index PL to identify the memory page 432, memory block 103, and memory plane 101 (in FIG. 3), respectively. The column address Y-ADDR can identify a byte or a word in the data of the memory page 432.

The voltage generator 65 can generate voltages to be supplied to word lines and bit lines under the control of the control circuit 70. The voltages generated by the voltage generator 65 include the read voltage $V_{read}$, the program voltage $V_{pgm}$, the pass voltage $V_{pass}$, the inhibit voltage $V_{inhibit}$, etc.

It is noted that the arrangement of the electronic components in the storage system 10 and the memory die 100 in FIGS. 1, 2A-2B, and 3-4 are shown as examples. The storage system 10 and the memory die 100 can have other layout and can include additional components. Components (e.g., control circuit 70, I/O buffer 55) on the memory die 100 shown in FIG. 4 can also be moved off the memory die 100, as a stand-alone electric component in the storage system 10. Components (e.g., control circuit 70, I/O buffer 55) on the memory die 100 shown in FIG. 4 can also be moved to other components in the storage system 10, for example, a portion of the control circuit 70 can be combined with the memory controller 20 and vice versa.

Figure 5:
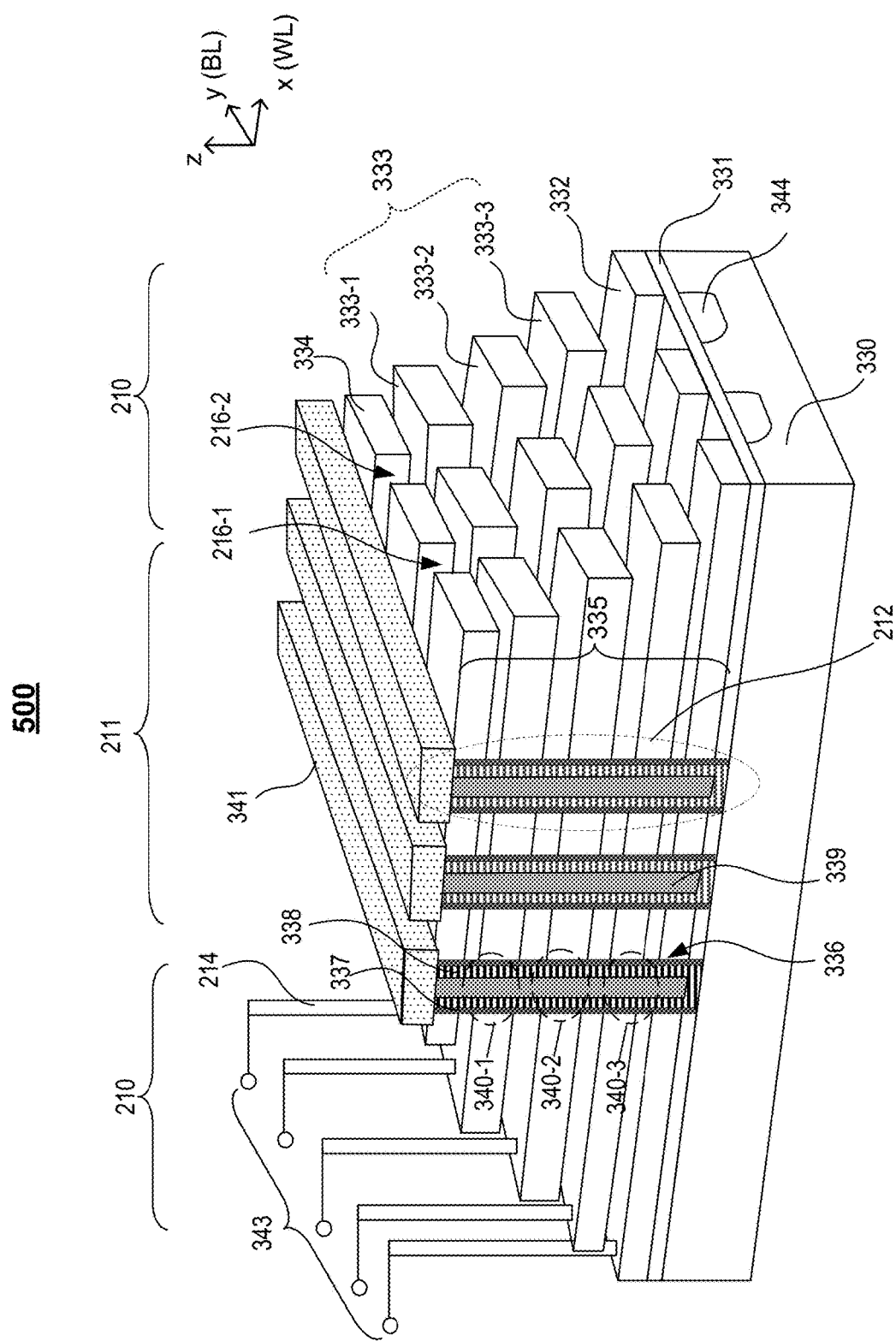
FIG. 5 illustrates a perspective view of a portion of a 3D memory structure, in accordance with some embodiments of the present disclosure.

FIG. 5 illustrates a perspective view of a 3D memory structure 500, according to some embodiments of the present disclosure. In some embodiments, the memory die 100 can be a 3D NAND memory, and the 3D memory structure 500 can be a portion of the memory die 100, for example, in a region 108 in FIG. 3. The 3D memory structure 500 can include a staircase region 210 and a channel structure region 211. The channel structure region 211 can include a plurality of memory strings 212, each including a plurality of stacked memory cells 340. The staircase region 210 can include a staircase structure.

The 3D memory structure 500 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 5 for clarity.

The control gates of each tier are separated by slit structures 216-1 and 216-2 through the film stack 335. The 3D memory structure 500 can also include a tier of top select gates (TSGs) 334 over the stack of control gates 333. The stack of TSG 334, control gates 333 and LSG 332 is also referred to as "gate electrodes." The 3D memory structure 500 further includes doped source line regions 344 in portions of substrate 330 between adjacent LSGs 332. Each memory strings 212 of the 3D memory structure 500 includes a channel hole 336 extending through the insulating film 331 and the film stack 335 of alternating conductive and dielectric layers. The memory string 212 can also include a memory film 337 on a sidewall of the channel hole 336, a channel layer 338 over the memory film 337, and a core filling film 339 surrounded by the channel layer 338. The memory cell 340 (e.g., 340-1, 340-2, 340-3) can be formed at the intersection of the control gate 333 (e.g., 333-1, 333-2, 333-3) and the memory string 212. A portion of the channel layer 338 responds to the respective control gate is also referred to as the channel 338 of the memory cell. The 3D memory structure 500 further includes a plurality of bit lines (BLs) 341 connected with the memory strings 212 over the TSGs 334. The 3D memory structure 500 can also include a plurality of metal interconnect lines 343 connected with the gate electrodes through a plurality of contact structures 214. The edge of the film stack 335 is configured in a shape of staircase to allow an electrical connection to each tier of the gate electrodes.

In FIG. 5, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The 3D memory structure 500 can also include other structures, for example, TSG cut, common source contact (i.e., array common source) and dummy memory string. These structures are not shown in FIG. 5 for simplicity. It is noted that the 3D memory structure 500 shown in FIG. 5 is only used as an example, which does not limit the scope of the present disclosure, and any other suitable 3D memory structure can also be adapted.

Referring back to FIG. 4, in some embodiments, the memory block 103 can be formed based on floating gate technology. In some embodiments, the memory block 103 can be formed based on charge trapping technology. The NAND flash memory based on charge trapping can provide high storage density and high intrinsic reliability. Storage data in the form of logic states ("states," e.g., threshold voltages $V_{th}$ of the memory cell 340) depends on the number of charge carriers trapped in the memory film 337 of the memory cell 340.

In a NAND flash memory, a read operation and a write operation (also referred to as program operation) can be performed for the memory page 432, and an erase operation can be performed for the memory block 103.

In a NAND memory, the memory cell 340 can be in an erased state ER or a programmed state P1. Initially, the memory cells 340 in the memory block 103 can be reset to the erased state ER as logic "1" by implementing a negative voltage difference between the control gates 333 and the channel 338 such that trapped charge carriers in the memory film of the memory cells 340 can be removed. For example, the negative voltage difference can be induced by setting the control gates 333 of the memory cells 340 to ground, and applying a high positive voltage (an erase voltage $V_{erase}$) to the ACS 430. At the erased state ER ("state ER"), the threshold voltage $V_{th}$ of the memory cells 340 can be reset to the lowest value.

During programming (i.e., writing), a positive voltage difference between the control gates 333 and the channel 338 can be established by, for example, applying a program voltage $V_{pgm}$ (e.g., a positive voltage pulse between 10 V and 20 V) on the control gate 333, and grounding the corresponding bit line 341. As a result, charge carriers (e.g., electrons) can be injected into the memory film of the memory cell 340, thereby increasing the threshold voltage $V_{th}$ of the memory cell 340. Accordingly, the memory cell 340 can be programmed to the programmed state P1 ("state P1" or logic "0").

The state of the memory cell (e.g., state ER or state P1) can be determined by measuring or sensing the threshold voltage $V_{th}$ of the memory cell. During a read operation, a read voltage $V_{read}$ can be applied on the control gate 333 of the memory cell and current flowing through the memory cell can be measured at the bit line 341. A pass voltage $V_{pass}$ can be applied on unselected word lines to switch on unselected memory cells.

A NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores 1 bit and has two logic states ("states"), logic {1 and 0}, i.e., states ER and P1. In the MLC mode, a memory cell stores 2 bits, and has four logic states, logic {11, 10, 01, and 00}, i.e., states ER, P1, P2, and P3. In the TLC mode, a memory cell stores 3 bits, and has eight logic states, logic {111, 110, 101, 100, 011, 010, 001, 000}, i.e., states ER, and states P1-P7. In the QLC mode, a memory cell stores 4 bits and has 16 logic states. The memory controller 20 of the storage system 10 (see FIG. 1) can convert data received from the host computer 15 into corresponding logic states of the memory cells on the memory dies 100 and vice versa.

Figure 6:
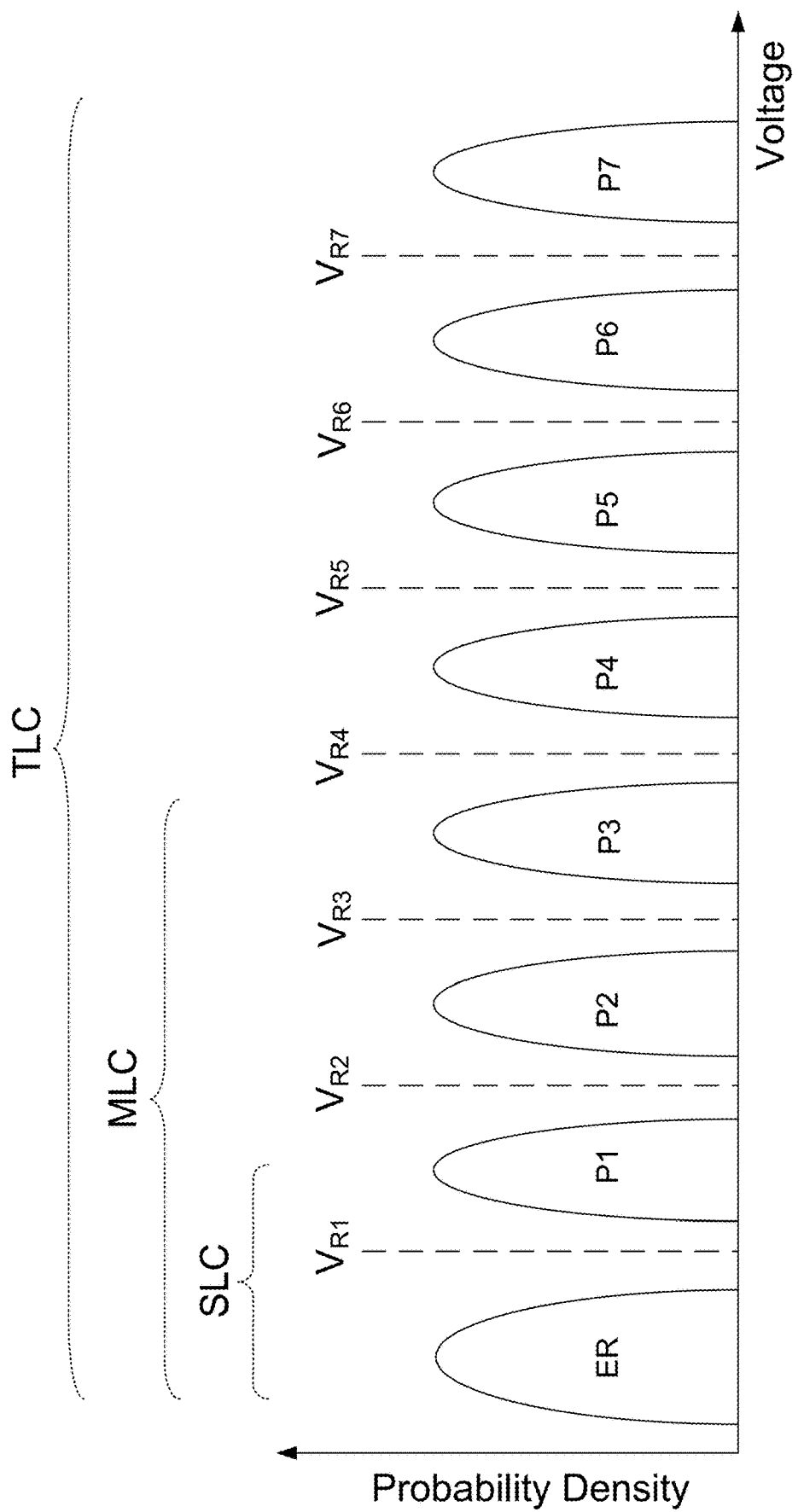
FIG. 6 illustrates a threshold voltage $V_{th}$ distribution of a NAND flash memory, according to some embodiments of the present disclosure.

FIG. 6 illustrates a threshold voltage $V_{th}$ distribution of a NAND flash memory programmed in the triple-level cell (TLC) mode, according to some embodiments of the present disclosure. Due to various variations, each state of the memory cells includes a range of threshold voltages $V_{th}$, where the threshold voltage $V_{th}$ distribution of each state can be represented by a probability density. In some embodiments, the eight TLC states can be programmed by using an incremental step pulse programming (ISPP) scheme where the programming voltage $V_{pgm}$ can be incrementally increased by adding a step pulse $V_{step}$. Accordingly, the eight TLC states can be programmed from the state P1 with a lower threshold voltage to the state P7 with a highest threshold voltage.

After programming, the eight TLC states ER and P1-P7 can be verified by using one or more read reference voltages $V_{R1}$-$V_{R7}$ during a verification process. By applying one or more of the read reference voltages $V_{R1}$-$V_{R7}$ to the control gate of a target memory cell, the range of the memory cell's threshold voltage $V_{th}$ can be determined. For example, to verify if a memory cell is at state ER, the read reference voltage $V_{R1}$ can be used. If the target memory cell is at state ER, the threshold voltage $V_{th}$ of the target memory cell is lower than the read reference voltage $V_{R1}$. The target memory cell can be switch on and form a conductive path in the channel. If the target memory cell is at any one of the states P1-P7, the threshold voltage $V_{th}$ of the target memory cell is higher than the read reference voltage $V_{R1}$. The target memory cell is thereby switched off. By measuring or sensing the current through the target memory cell at the corresponding bit line, via the page buffer/sense amplifier 50, the threshold voltage $V_{th}$ or the state of the target memory cell can be verified.

As described above, to determine the two states ER and P1 stored in the SLC mode, only the read reference voltage $V_{R1}$ is needed. To determine the four states ER and P1-P3 in the MLC mode, the read reference voltages $V_{R1}$, $V_{R2}$ and $V_{R3}$ can be used. To determine the eight states ER and P1-P7 for the TLC mode, the read reference voltages $V_{R1}$-$V_{R7}$ can be used. For example, in the TLC mode, the threshold voltage of state ER is below $V_{R1}$, and the threshold voltage of state P7 is above $V_{R7}$, where the threshold voltages of state P1 is between $V_{R1}$ and $V_{R2}$. States P2-P6 can be determined similarly.

Figure 7:
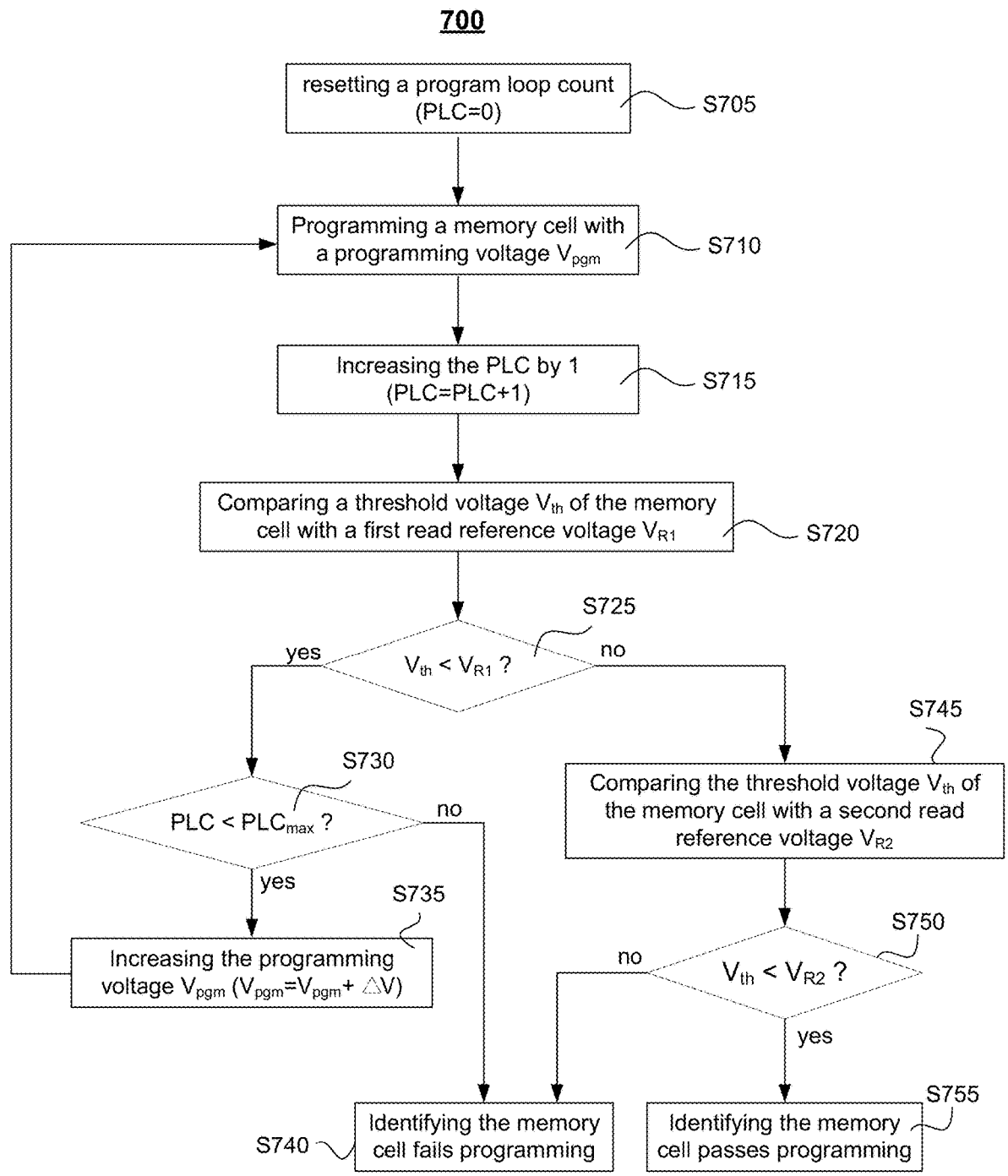
FIG. 7 illustrates a method of programming a memory cell, according to some embodiments of the present disclosure.

FIG. 7 illustrates a process flow 700 for programming a memory cell to a target logic state (e.g., the state P1), according to some embodiments of the present disclosure. It should be understood that the process flow 700 is not exhaustive and that other operation steps can be performed as well before, after, or between any of the illustrated operation steps. In some embodiments, some operation steps of the process flow 700 can be omitted or other operation steps can be included, which are not described here for simplicity. In some embodiments, operation steps of the process flow 700 can be performed in a different order and/or vary.

At operation step S705, a program loop count (PLC) can be reset, for example, PLC=0. The operation step S705 can be started when the memory controller 20 (in FIG. 1) sends a command to the memory die 100 for programming the memory cell on the memory die 100.

At operation step S710, a memory cell is programmed by applying a programming voltage $V_{pgm}$ to a word line of the memory cell. And the PLC can be increased by 1 at operation step S715, i.e., PLC=PLC+1. The programming voltage $V_{pgm}$ can be selected according to the target logic state of the memory cell, where the target logic state depends on programming data sent by the memory controller 20.

At operation step S720, a threshold voltage $V_{th}$ of the memory cell can be compared with a first read reference voltage by applying the first read reference voltage on the word line of the memory cell and measuring the current flowing through the memory cell at the corresponding bit line. For example, if the memory cell is to be programmed to a target logic state of P1, the first read reference voltage $V_{R1}$ can be used (see FIG. 6) because for the state P1, the threshold voltage of the memory cell needs to be between the read reference voltages $V_{R1}$ and $V_{R2}$.

At operation step S725, the threshold voltage $V_{th}$ of the memory cell is determined whether it is higher or lower than the first read reference voltage $V_{R1}$. As discussed previously, if the threshold voltage $V_{th}$ of the memory cell is lower than the first read reference voltage $V_{R1}$, the memory cell can be switch on, forming a conductive path in the channel. The current measured at the corresponding bit line by the page buffer/sense amplifier 50 (in FIG. 4) is relatively higher. If the threshold voltage $V_{th}$ of the memory cell is higher than the first read reference voltage $V_{R1}$, the memory cell is switched off and the current measured at the corresponding bit line by the page buffer/sense amplifier 50 is relatively lower.

If the threshold voltage $V_{th}$ of the memory cell is determined to be lower than the first read reference voltage $V_{R1}$, the process flow 700 goes to operation step S730, where the PLC is checked if it is less than a maximum value $PLC_{max}$.

In some embodiments, the maximum value PLC max can be a predetermined value, e.g., $PLC_{max}$=25. In some embodiments, the maximum value $PLC_{max}$ can be determined from PLCs of a set of memory cells selected across different memory dies during a pre-screening programming test.

If the PLC is less than $PLC_{max}$, at operation step S735, the programming voltage $V_{pgm}$ can be increased by an amount $\Delta V$, such that the programming voltage $V_{pgm}=V_{pgm}+\Delta V$. And the memory cell can be re-programmed again with the increased programming voltage $V_{pgm}$ at operation step S710.

The operation steps S710-S735 can be repeated until the desired target threshold voltage $V_{th}$ is reached for the memory cell. However, if at operation step S730, the PLC max has been reached but the memory cell is still not programmed to the target logic state, the memory cell can be identified having programming failure at step S740.

If at operation step S725, the threshold voltage $V_{th}$ of the memory cell is determined to be higher than the first read reference voltage $V_{R1}$, it can be compared with a second read reference voltage at operation step S745. If the memory cell is to be programmed to the target logic state of P1, the second read reference voltage $V_{R2}$ can be used (see FIG. 6). If the threshold voltage $V_{th}$ of the memory cell is determined to be lower than the second read reference voltage $V_{R2}$ at operation step S750, the memory cell can be identified as programming pass (i.e., programmed to a target logic state) at operation step S755. In the SLC mode with only state ER and P1, the second reference voltage can be omitted.

However, if the threshold voltage $V_{th}$ of the memory cell is determined to be higher than the second read reference voltage $V_{R2}$ at operation step S750, the memory cell can be identified having programming failure at step S740 because during programming the threshold voltage of a memory cell can be increased by applying the programming voltage $V_{pgm}$ on its control gate (i.e. corresponding word line), but cannot be decreased. In a 3D NAND memory, a memory cell can be re-programmed to a logic state with a lower threshold voltage after the memory cell is erased and reset to the state ER. The erase operation reset all memory cells in the memory block to the state ER because the memory cells in the same memory block share the same array common source 430.

Referring back to FIG. 4, while a memory block (e.g., the memory block 103) is the smallest erasable unit in a 3D NAND memory, a memory page (e.g., the memory page 432) is the smallest addressable unit for read and program operations. During the read and program operations, data (i.e., logic states) in a memory page of a selected memory block can be read or programmed according to the page index PD and the block index BD included in the address ADDR received by the control circuit 70. The memory cells which have reached a target logic state (i.e., a target threshold voltage) can be inhibited from further programming by applying the inhibit voltage $V_{inhibit}$ on the corresponding bit lines 341.

Figure 8:
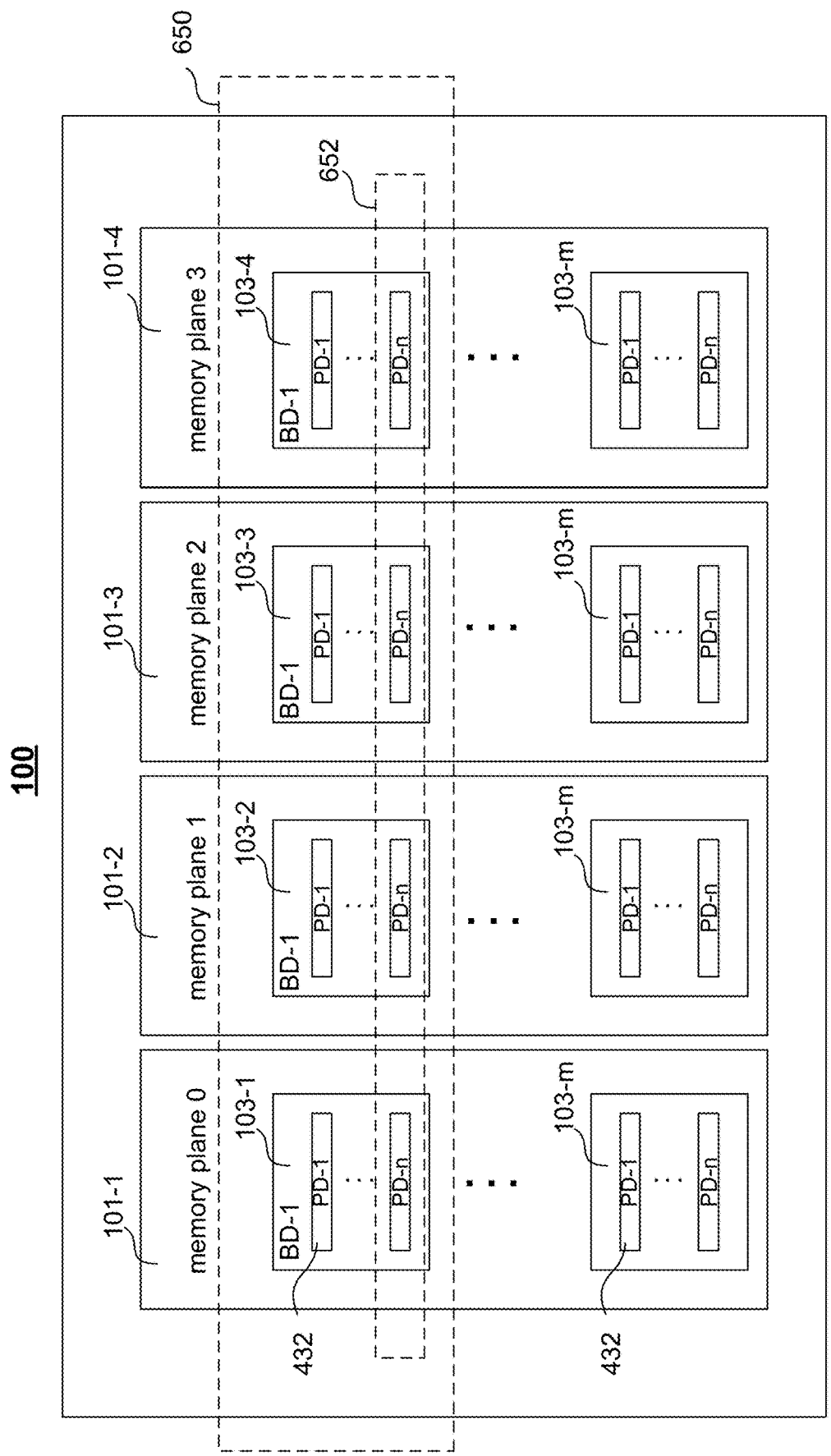
FIG. 8 illustrates a schematic diagram of a memory die with multiple memory planes, according to some embodiments of the present disclosure.

FIG. 8 illustrates a schematic diagram of a memory die with multiple memory planes, according to some embodiments of the present disclosure. As an example, the memory die can be the memory die 100 shown in FIG. 3 having four memory planes 101-1, 101-2, 101-3 and 101-4, for example. In some embodiments, different memory planes (e.g., memory planes 101-1, 101-2, 101-3 and 101-4) can execute the read operation or the program operation in parallel. Because the memory planes in the same memory die share a single set of data and control buses, a read or program operation can be performed in different memory planes in the same memory die sequentially. For example, memory blocks in each memory plane can be identified with the block index BD that is unique within the memory plane, but can be shared across multiple memory planes. As shown in FIG. 8, the memory blocks 103-1, 103-2, 103-3 and 103-4 in respective memory planes 101-1, 101-2, 101-3 and 101-4 share the same block index BD-1. Within the memory block, each memory page can be identified with the page index PD that is unique within the memory block. In the example in FIG. 8, the memory pages 432 in the memory block 103-1 can be identified with page indexes PD-1, PD-2, PD-n. In some embodiments, the firmware 21 in the memory controller 20 (see FIG. 1) can group the memory blocks (e.g., 103-1, 103-2, 103-3 and 103-4) with the same block index (e.g., BD-1) across multiple memory planes (e.g., 101-1, 101-2, 101-3, 101-4) together into a super block 650, within which the memory pages with the same page index (e.g., PD-n) can be grouped as a super page 652. To improve throughput and efficiency, data of the entire super page 652 can be read or programmed simultaneously (i.e., in parallel) in a 3D NAND memory.

In a 3D NAND memory with aggressively increased density, reliability can be impacted by many errors, for example, program/erase (P/E) cycling errors, cell-to-cell program interference errors, program errors, read disturb errors, retention errors and process variation errors. In general, the memory controller 20 (see FIG. 1) can implement ECC algorithms or redundant array of independent disk (RAID) techniques to detect and correct data having raw bit errors.

For example, in a UFS system, error caused by read fail can be recovered by the following methods: ready retry, soft decode, 2WL-RAID, lock buffer and SLC backup. In one example, the threshold voltage of a memory cell can drift due to, for example, rising temperature. If the drift is predictable, a read-retry table can be generated and stored in the storage system. When temperature sensor detects the rising temperature, a revised read voltage can be applied to the word line of the memory cell, where the revised read voltage has a predetermined offset from a nominal read voltage. In another example, soft decode can be used to adjust the read reference voltage in a certain range (e.g., ±1V) so as to find a minimum fail bit count (FBC). In some embodiments, the 2WL-RAID method can implement an algorithm to correct read fails using data from memory cells addressed by two word lines. The 2WL-RAID method can be applied when read fails do not occur to the memory cells with the same string index (also referred to as the column address Y-ADDR) across multiple memory planes. The other two data recovery techniques (i.e., lock buffer and SLC backup) consumes substantial resources. In some embodiments, after the memory controller sends the programming data to the memory die, the programming data temporally stored in a memory buffer in the memory controller can be retained for specific super pages or word lines such that when read error or program error occurs, the programming data can be recovered from the memory buffer in the memory controller. Similarly, SLC backup can also be implemented for specific super pages or word lines such that redundant memory cells in the SLC mode can be used to store backup data.

However, error can also occur at weak memory cells that are not identified as defective during a single program operation and its subsequent verification process (e.g., following the method 700). As discussed previously with respect to FIG. 7, a memory cell can be considered successfully programmed if a target logic state is detected during the verification process (e.g., operation steps S715-S755). And a memory block or memory page can be considered having a passing program status if all the memory cells are verified to be programmed to the target logic states. However, it is possible that a memory cell can have the passing program status after re-programmed (i.e., attempted) many times with the PLC larger than expected, but as long as the PLC is less than the $PLC_{max}$ (see FIG. 7). Similarly, a memory block or memory page can have the passing program status after some of the memory cells are re-programmed (i.e., attempted) many times with the PLC less than the $PLC_{max}$ but much larger than expected. In this scenario, the memory block, memory page, or the memory cell can be vulnerable, where defects in those memory cells can deteriorate after many cycles of programming and erasing, and can cause the 3D NAND memory breakdown, i.e., lose the data, at an unexpected time.

Although at the system level, various techniques (e.g., error correction code (ECC)) can be implemented to correct raw bit errors, many errors are uncorrectable using conventional techniques. Therefore, a need exists for a method and a system to provide data protection before an uncorrectable error correction code (UECC) appears such that chances of data loss can be minimized.

Figure 9:
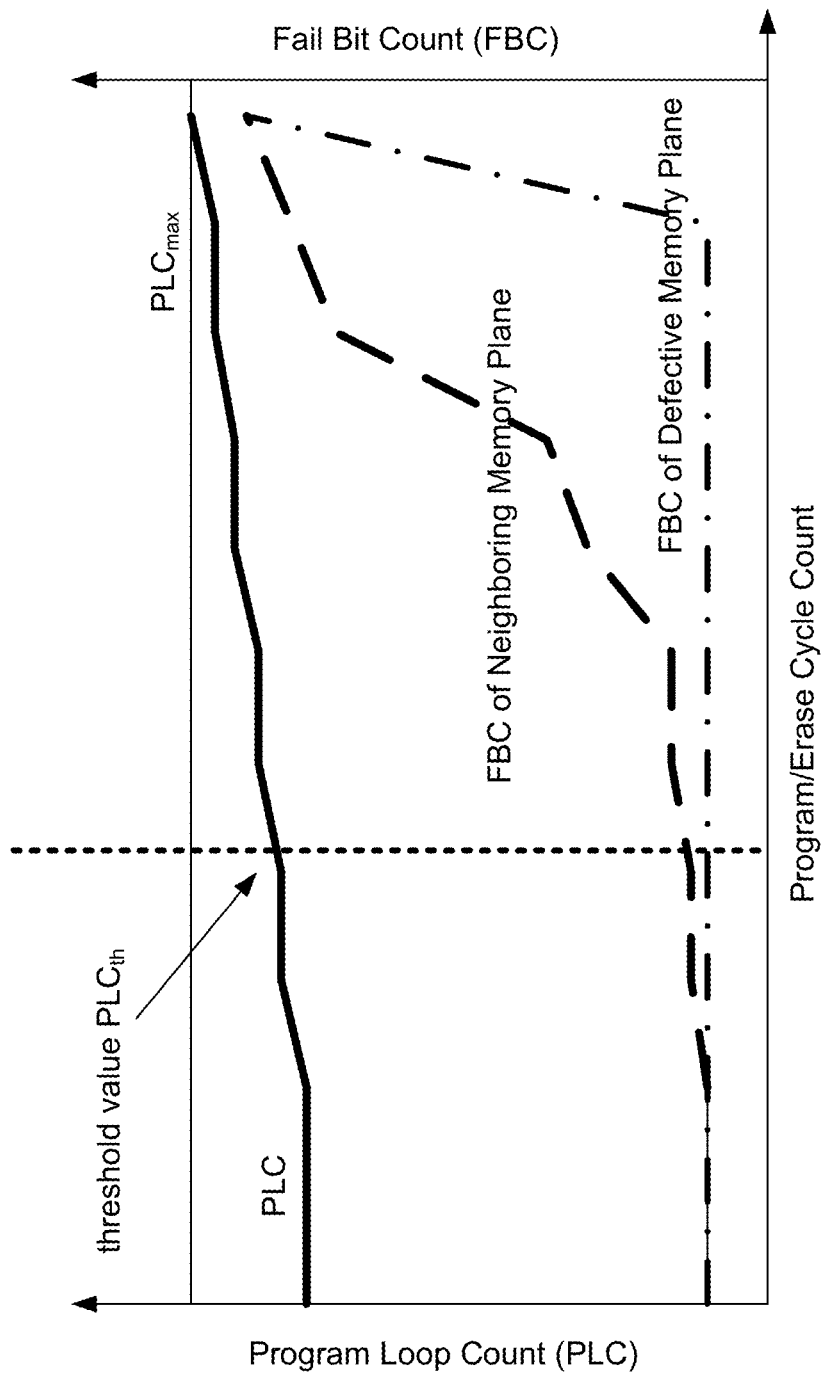
FIG. 9 illustrates fail bit counts (FBCs) in a 3D NAND memory, according to some embodiments of the present disclosure.

FIG. 9 illustrates fail bit count (FBC) in a 3D NAND memory, according to some embodiments of the present disclosure. The FBC of a defective memory plane and a neighboring memory plane increase after many cycles of programming and erasing, i.e., when a program/erase (P/E) cycle count increases. The increased FBC can result from P/E cycling errors when either an erase operation fails to reset a memory cell to the ER state; or a program operation fails to set the memory cell to the desired target state. P/E cycling errors occur because electrons become trapped in the memory film after stress from repeated P/E cycles. Errors due to such electron trapping accumulate over the lifetime of the 3D NAND memory until the 3D NAND memory worn out. Thus, when the memory block is erased and programmed for many cycles, an increased number of raw bit errors need to be corrected. As discussed previously, the memory controller 20 can correct many raw bit errors by implementing ECC algorithms or RAID techniques. However, some raw bit errors cannot be recovered by ECC or RAID, and the memory controller 20 will indicate an unrecoverable ECC (UECC) for such failures.

Additionally, after many cycles of programming and erasing, the PLC of the defective memory plane steadily increases. Before the PLC reaches the PLC max, the FBC of the defective memory plane remains low, but neighboring plane disturb could have occurred such that the FBC of the neighboring memory plane rises even when PLC is much lower than $PLC_{max}$. Therefore, data protection should have taken place in a weak memory plane or a weak memory cell when PLC starts to rise to avoid data loss. As such, a storage system can predetermine a threshold value $PLC_{th}$ according to the FBC of a neighboring memory plane before the FBC of the neighboring memory plane rises with the P/E cycles. The threshold value $PLC_{th}$ can be much less than the $PLC_{max}$. In some embodiments, the $PLC_{th}$ can be pre-set at manufacturing factory during product screening test, for example, using the function of FBC of the neighboring memory plane in terms of P/E cycle count as shown in FIG. 9. In some embodiments, the $PLC_{th}$ can be set to the PLC after a first programming operation. For example, after a memory cell is successfully programmed for a first time, the PLC used by the memory cell can be selected as the $PLC_{th}$ for the memory cell, where the memory cell can be considered risky or weak after many cycles of programming and erasing such that the PLC needed for successful programming increases (i.e., larger than the $PLC_{th}$). In another example, after all the memory cells in a memory page are successfully programmed for a first time, a largest PLC used for programming the memory page can be selected as the $PLC_{th}$ for the memory cells in the memory page. It is noted that $PLC_{th}$ can be determined by other method and technique, and is not limited to the example shown in FIG. 9. The $PLC_{th}$ can be determined by any suitable method where a weak memory cell can be identified before actual data loss takes place.

Figure 10:
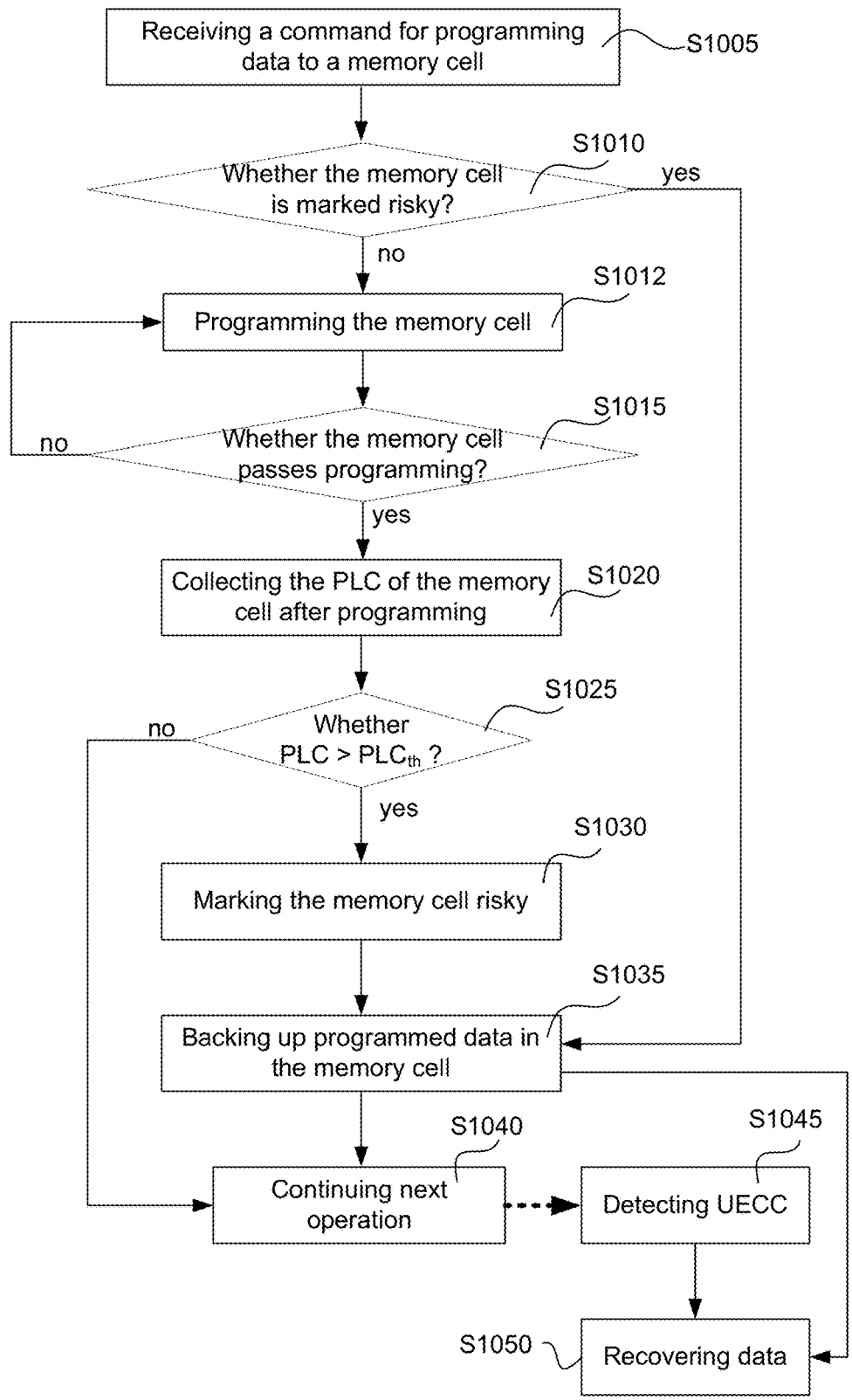
FIG. 10 illustrates a method of programming a memory cell, according to some embodiments of the present disclosure.

FIG. 10 illustrates a process flow 1000 for programming a memory cell using a data protection technique, according to some embodiments of the present disclosure. It should be understood that the process flow 1000 is not exhaustive and that other operation steps can be performed as well before, after, or between any of the illustrated operation steps. In some embodiments, some operation steps of the process flow 1000 can be omitted or other operation steps can be included, which are not described here for simplicity. In some embodiments, operation steps of the process flow 1000 can be performed in a different order and/or vary.

At operation step S1005, the control circuit 70 (in FIG. 4) of the memory die 100 receives a command from the memory controller 20 (in FIG. 1) of the storage system 10 for programming a memory cell on the memory die 100. In addition to the command, the memory controller 20 also sends programming data to the memory die 100. Data to be programmed are received at the control circuit 70 from the memory controller 20. As discussed previously, memory cells in a memory page can be programmed simultaneously. The memory cell to be programmed can be located through the row address X-ADDR (including include the page index PD, the block index BD and the plane index PL) and the column Y-ADDR (see FIG. 4). The memory cell can be programmed to a target logic state (e.g., state P1 in FIG. 6) according to the programming data.

Before performing the program operation, the process flow 1000 includes an operation step S1010, where it is checked whether the memory cell (or the memory page or the memory block) is marked as "risky." The memory cell can be marked as risky previously from a previous programming operation.

If the memory cell (or the memory page or the memory block) is not marked risky, then at operation step S1012, the memory cell can be programmed. The programming details have been discussed with respect to operation step S710 in FIG. 7. In some embodiments, all memory cells in a memory page can be programmed simultaneously. In this example, the memory page can be at least a portion of the super page 652 in FIG. 8 and the memory block can be at least a portion of the super block 650. In some embodiments, the memory cell can be programmed to any logic states of the SLC mode, MLC mode, TLC mode or QLC mode of a 3D NAND memory (e.g., memory die 100 in FIGS. 3-6). In some embodiments, the program loop count (PLC) can be used to track the number of attempts in programming the memory cell to the target logic state according to the data received at the control circuit 70, following the process flow 700 illustrated in FIG. 7.

At operation step S1015, it is checked whether the memory cell passes the programming, for example, completing the process flow 700 and reaching the operation step S755.

If the memory cell is not programmed successfully, the operation step S1015 can be repeated, similar to the process steps S710-S755 described with respect to FIG. 7. In the other words, after programming the memory cell, it is verified whether the memory cell is at a target logic state according to the programming data; and the programming of the memory cell will be repeated when the memory cell is not at the target logic state.

At operation step S1020, the PLC of the memory cell used to pass programming is collected, according to the process flow 700. As discussed previously, the PLC tracks a repeated number of the programming.

At operation step S1025, the PLC is compared with the threshold value $PLC_{th}$, predetermined according to FIG. 9. As discussed previously, a previous PLC can be selected as the threshold value $PLC_{th}$, wherein the previous PLC was used by a previous programming operation and was collected after the memory cell was programmed successfully to a previous target logic state. If the PLC is not larger than the threshold value $PLC_{th}$, the process flow 1000 moves to operation step S1040 to continue a next operation. If the PLC is larger than the threshold value $PLC_{th}$, the memory cell can be considered weak or risky. Accordingly, the weak memory cell and/or the memory page containing the weak memory cell can be marked as weak or risky at operation step S1030. Similarly, the memory block containing one or more memory pages marked risky can also be marked risky.

Because the memory cell has been considered passing the programming at operation step S1015, i.e., the memory cell has been programmed to the target logic state according to the command and data received by the memory die, the data stored in the memory cell (i.e., logic state) can be backed up (i.e., copied) in a redundant memory cell at operation step S1035. In the other words, a portion of the programming data associated with the memory cell can be backed up in response to a program loop count (PLC) that is larger than the threshold value $PLC_{th}$. In some embodiments, backing up the portion of the programming data associated with the memory cell includes programming a redundant memory cell with the portion of the programming data associated with the memory cell. Similarly, the data stored in the memory page or the memory block containing the memory cell can also be backed up in a redundant memory page or a redundant memory block. IN the other words, portions of the programming data associated with the memory page can be backed up in response to the PLC of the memory cell that is larger than the threshold value $PLC_{th}$. The backing up the portions of the programming data associated with the memory page includes programming a redundant memory page with the portions of the programming data associated with the memory page. As such, a risky memory cell, a risky memory page or a risky memory block has a backup in the storage system, before they actually break down.

If at operation step S1010, the memory cell or the memory page/memory block containing the memory cell has been marked risky in a previous event, the process flow 1000 is directed to the operation step S1035, where data to be programmed in the memory cell can be backed up first prior to programming the memory cell. In the other words, prior to programming the memory cell, the portion of the programming data associated with the memory cell can be backed up in response to a previous risky marking of the memory cell from a previous programming operation. In some embodiments, backing up the portion of the programming data associated with the memory cell includes programming a redundant memory cell with the portion of the programming data associated with the memory cell. In some embodiments, portions of the programming data associated with the memory page can be backed up in response to the previous risky marking of the memory cell.

After making a copy of the data to be programmed or having been programmed in the risky memory cell/page/block, the process flow 1000 goes to operation step S1040 where a next operation can be continued.

In some embodiments, checking whether $PLC > PLC_{th}$, marking the memory cell risky at the process step S1030, and backing up programmed data in the memory cell at process step S1035 can be performed during programming the memory cell at process step S1012, prior to confirming the memory cell passes the programming (process steps S1015).

An advantage of running the process flow 1000 can be seen in operation steps S1045 and S1050. When an uncorrectable ECC (UECC) is detected by the storage system at operation step S1045, for example, due to wearing out of the risky memory cell/page/block after many P/E cycles, data can be recovered at operation step S1050 from the redundant memory cell/page/block implemented at operation step S1035. In some embodiments, recovering data from the redundant memory cell/page/block includes performing a read operation from the redundant memory cell/page/block.

As such, weak or risky memory cells, memory pages or memory blocks that have been programmed successfully can be identified, and data stored in the risky memory cells, memory pages and memory blocks can be backed up in advance before UECC happens. Therefore, chances of data loss in the 3D NAND memory can be greatly reduced.

Figure 11:
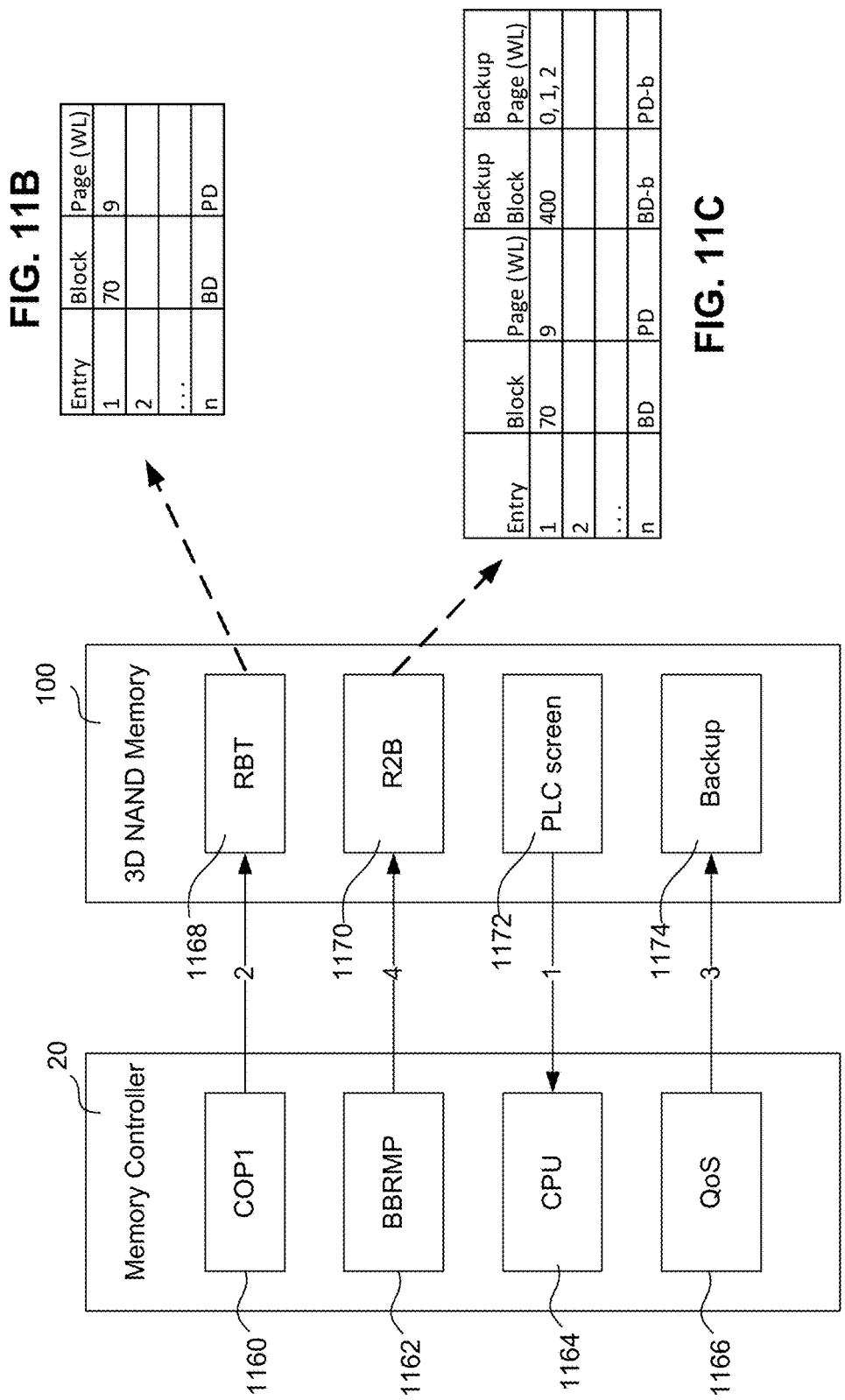
FIGS. 11A-11C illustrate a configuration of data protection in a storage system, according to some embodiments of the present disclosure.

FIGS. 11A-11C illustrate a configuration 1100 of data protection in a storage system, according to some embodiments of the present disclosure. The data protection can be executed by a memory controller (e.g., the memory controller 20 in FIG. 1) and a 3D NAND memory (e.g., the memory die 100 in FIGS. 3-6) in the storage system (e.g. the storage system 10 in FIG. 1). The following modules in the memory controller 20 can be implemented either in hardware or firmware: a correction of programming (COP1) module 1160, a bad block remapping (BBRMP) module 1162, a processor (CPU) 1164 and a quality-of-service (QoS) module 1166. Similarly, the 3D NAND memory 100 can implement the following modules in hardware or firmware: a risky block table (RBT) 1168, a risky to backup (R2B) module 1170, a PLC screen module 1172, and a backup module 1174.

In some embodiments, the CPU 1164 and the PLC screen module 1172 can perform the process flow 1000 in FIG. 10, where the PLC can be compared with the threshold value $PLC_{th}$. If the PLC of a memory cell in the memory page or memory block is larger than the threshold value $PLC_{th}$, the memory cell or the memory page/the memory block containing the memory cell can be considered risky as discussed previously. The address of the risky memory cell or the memory page/memory block containing the risky memory cell (e.g., the page index PD and the block index BD) can be send to the CPU 1164 in the memory controller 20.

At step 2, the COP1 module 1160 and the RBT module 1168 can create a risky block table (RBT) (shown in FIG. 11B). The RBT 1168 includes a first set of addresses, where the first set of addresses identify the risky memory blocks and/or memory pages (or a super page addressed by a word line) according to the PLC screen module 1172.

At step 3, the QoS module 1166 sends a queuing instruction to the backup module 1174 to schedule the backup of the data in the risky memory cell/page/block to a redundant memory cell/page/block on the 3D NAND memory 100. QoS of a storage system refers to the consistency and predictability of latency and IOPS (IOs Per Second) performance while performing read and program operations. Here, the QoS module 1166 can prioritize the read/program operations and the backup activities such that the overall performance of the storage system is optimized. For example, over a given period of time (e.g., 0.5 ms), the storage system's latency stay within a specified range (e.g., 99.9%) without having unexpected outliers causing a sudden drop in application performance.

At step 4, the BBRMP module 1162 and the R2B module 1170 can create the risky to backup (R2B) table (shown in FIG. 11C). The R2B table includes two sets of addresses, the first set of addresses and a second set of addresses. The first set of addresses is the same as the first set of addresses in the RBT 1168, representing the addresses of the risky memory block or the risky memory page, which can be identified by using the block index BD and the page index PD. The second set of addresses represent the addresses of the redundant memory block or redundant memory page and can be identified by using the block index BD-b and the page index PD-b. As an example in FIG. 11C, a risky memory page can be identified using page index (or word line number) 9 and the block index 70. The corresponding backup data in the redundant memory page and the redundant memory block can be located at the page index 0, 1, and 2 with block index 400.

Therefore, using the configuration 1100 of data protection, data loss can be prevented by identifying risky memory pages and/or memory blocks during normal programming and reading operations.

Figure 12:
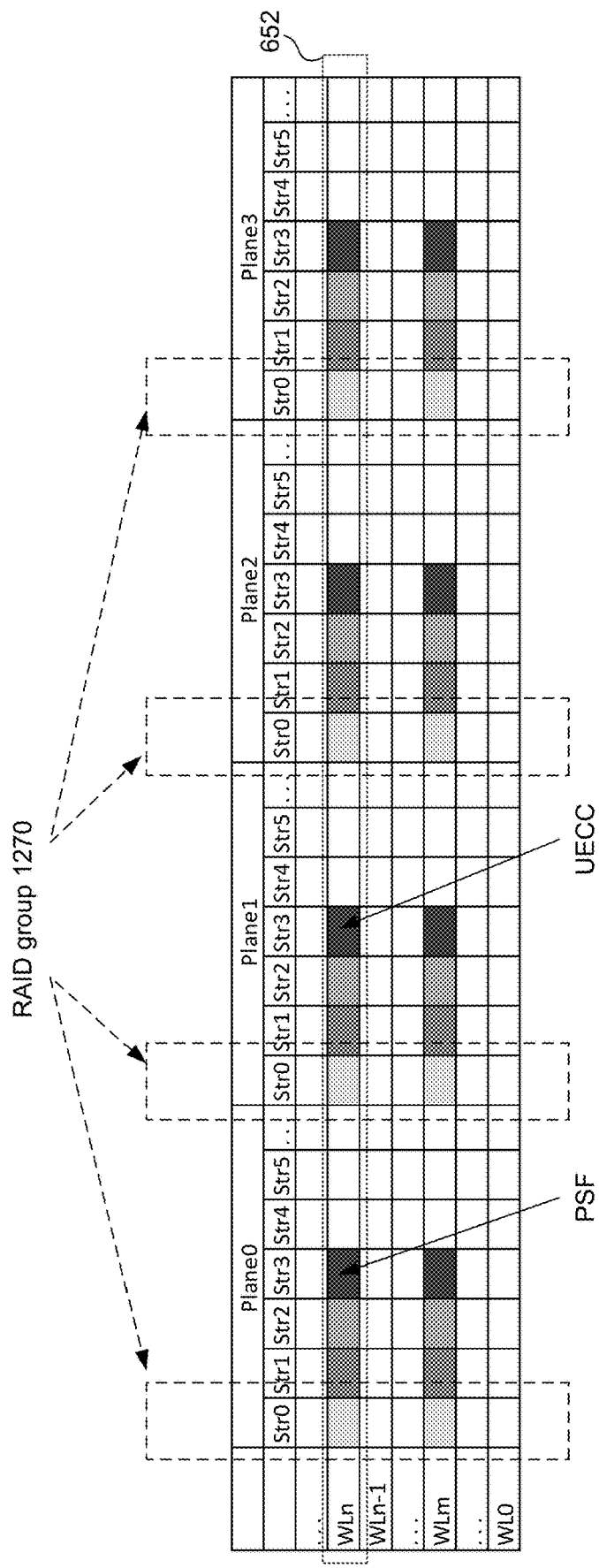
FIG. 12 illustrates an application of the data protection method described in FIGS. 10 and 11A-11C, according to some embodiments of the present disclosure.

FIG. 12 illustrates an application of the data protection methods described with respect to FIGS. 10 and 11A-11C, according to some embodiments of the present disclosure. In this example, each box represent a memory cell, where memory cells associated with the same word line (e.g., WLn) forms the super page 652 across different memory planes (e.g., plane0, plane1, plane2 and plane3). In this example, the memory cells in each memory plane can also be identified with column addresses, for example Str0, Str1, Str2, Str3, . . . etc. As discussed previously, memory cells of the same memory page (e.g., super page 652) can be read or programmed simultaneously. In some embodiments, read fails can be recovered by the 2WL-RAID method. For example, the 2WL-RAID method can fix read fail in one of the eight memory cells of a RAID group 1270, where the eight memory cells of the RAID group 1270 have the same column address (e.g., Str0) in plane0, plane1, plane2 and plane3 and associated with two word lines (e.g., WLn or WLm). If read fail occurs at more than one memory cells in the RAID group 1270, the 2WL-RAID method cannot recover the data.

However, during programming of a super page, neighboring plane disturb can occur when a memory cell experiences program status fail (PSF) that causes read fails in memory cells across different memory planes with the same column address because of shared circuitry and signals (e.g., for X-path control). For example, when the memory cell on WLn with column address Str3 in plane 0 has PSF, the memory cell on WLn with column address Str3 in plane 1 can have read fail, which is unrecoverable by the 2WL-RAID method. The memory cell with column address Str3 in plane 1 on WLn will be marked with an UECC.

By using the method of data protection shown in FIGS. 10 and 11A-C, the data of a super page can be backed up (i.e., copied) in a redundant super page when the PLC of a memory cell is larger than the threshold valve $PLC_{th}$ during programming, indicating that the memory cell can be risky or weak but has not experienced PSF. As such, when the memory cell suffers PSF and memory cells in neighboring memory planes suffer UECC, the previously backed-up data can be used to recover the data in these failed memory cells (e.g., by reading the data from redundant memory cells). Data loss can thereby be avoided.

In summary, the present disclosure provides a method of data protection for a three-dimensional NAND memory. The method includes programming a memory cell of the 3D NAND memory according to programming data; and backing up a portion of the programming data associated with the memory cell in response to a program loop count (PLC) that is larger than a threshold value, where the PLC tracks a repeated number of the programming of the memory cell. A previous PLC can be set as the threshold value, where the previous PLC was used by a previous programming operation and was collected after the memory cell was programmed successfully to a previous target logic state.

The present disclosure also provides a memory storage system. The memory storage system includes a three-dimensional (3D) NAND memory and a memory controller. The 3D NAND memory includes a plurality of memory strings, penetrating through a film stack of alternating conductive and dielectric layers disposed on a substrate, wherein each memory string comprises a plurality of memory cells. The memory controller is configured to send programming data to the 3D NAND memory to program a memory cell; and back up a portion of the programming data associated with the memory cell in response to a program loop count (PLC) that is larger than a threshold value.

The present disclosure further provides a memory controller for a three-dimensional (3D) NAND memory. The memory control is configured to send programming data to the 3D NAND memory to program a memory cell; and back up a portion of the programming data associated with the memory cell in response to a program loop count (PLC) that is larger than a threshold value, wherein the 3D NAND memory comprises a plurality of memory strings, penetrating through a film stack of alternating conductive and dielectric layers disposed on a substrate, wherein each memory string comprises a plurality of memory cells.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method of data protection for a three-dimensional (3D) NAND memory, comprising:
    programming a memory cell of the 3D NAND memory according to programming data;
    in response to programming the memory cell according to the programming data, verifying whether the memory cell is at a target logic state according to the programming data;
    determining a program loop count (PLC) of the memory cell;
    in response to the PLC being greater than a threshold value, designating the memory cell as risky;
    programming the memory cell according to second programming data;
    in response to programming the memory cell according to the second programming data, verifying whether the memory cell is at the target logic state according to the second programming data; and in response to verifying that the memory cell is at the target logic state and the memory cell being designated as risky, backing up a portion of the second programming data.

2. The method of claim 1, further comprising:

after programming the memory cell, verifying whether the memory cell is at a target logic state according to the programming data; and repeating the programming of the memory cell when the memory cell is not at the target logic state.

3. The method of claim 2, further comprising:

collecting the PLC that tracks a repeated number of the programming.

4. The method of claim 1, further comprising:

prior to programming the memory cell, backing up the portion of the programming data associated with the memory cell in response to a previous risky marking of the memory cell from a previous programming operation.

5. The method of claim 1, wherein the backing up portion of the programming data associated with the memory cell comprises programming a redundant memory cell with the portion of the programming data associated with the memory cell.

6. The method of claim 5, further comprising:

recovering the portion of the programming data associated with the memory cell from the redundant memory cell in response to an unrecoverable error correction code.

7. The method of claim 1, further comprising:

setting a previous PLC as the threshold value, wherein the previous PLC was used by a previous programming operation and was collected after the memory cell was programmed successfully to a previous target logic state.

8. The method of claim 1, wherein the programming the memory cell comprises:

programming the memory cell simultaneously with other memory cells in a memory page, wherein all memory cells in the memory page share a word line.

9. The method of claim 8, further comprising:

backing up portions of the programming data associated with the memory page in response to the PLC of the memory cell.

10. The method of claim 9, wherein the backing up the portions of the programming data associated with the memory page comprises programming a redundant memory page with the portions of the programming data associated with the memory page.

11. The method of claim 10, further comprising:

recovering the portions of the programming data associated with the memory page from the redundant memory page in response to an unrecoverable error correction code.

12. A memory storage system, comprising:

a three-dimensional (3D) NAND memory, comprising:

a plurality of memory strings, penetrating through a film stack of alternating conductive and dielectric layers disposed on a substrate, wherein each memory string comprises a plurality of memory cells; and a memory controller, configured to:

send programming data to the 3D NAND memory to program a memory cell;

in response to programming the memory cell according to the programming data, verify whether the memory cell is at a target logic state according to the programming data;

determine a program loop count (PLC) of the memory cell;

in response to the PLC being greater than a threshold value, mark the memory cell as risky:

program the memory cell according to second programming data;

in response to programming the memory cell according to the second programming data, verify whether the memory cell is at the target logic state according to the second programming data; and in response to verifying that the memory cell is at the target logic state and the memory cell being marked as risky, back up a portion of the second programming data.

13. The memory storage system of claim 12, wherein the PLC tracks a number of programming for the memory cell to reach a target logic state according to the programming data.

14. The memory storage system of claim 12, wherein the memory controller is further configured to create a risky block table for the 3D NAND memory, wherein the risky block table comprises a first set of addresses identifying the memory cell marked risky.

15. The memory storage system of claim 14, wherein the memory controller is further configured to create a risky to backup table for the 3D NAND memory, wherein the risky to backup table comprises:

the first set of addresses identifying the memory cell marked risky; and a second set of addresses identifying a redundant memory cell, wherein the redundant memory cell is programmed with the portion of the programming data associated with the memory cell marked risky.

16. The memory storage system of claim 15, wherein the memory controller is further configured to recover the portion of programming data associated with the memory cell from the redundant memory cell when an unrecoverable error correction code is received.

17. The memory storage system of claim 12, wherein the threshold value is a previous PLC used by a previous programming operation and was collected after the memory cell was programmed successfully to a previous target logic state.

18. The memory storage system of claim 12, wherein the memory controller is further configured to back up the portion of the programming data associated with the memory cell, in response to a previous risky marking of the memory cell from a previous programming operation, before the memory cell is programmed.

* * * * *